United States Patent [19]

Matsunaga

[11] Patent Number: 4,683,580
[45] Date of Patent: Jul. 28, 1987

[54] CCD OUTPUT SIGNAL PROCESSING CIRCUIT FOR USE IN AN IMAGE PICK-UP DEVICE

[75] Inventor: Yoshiyuki Matsunaga, Kamakura, Japan

[73] Assignee: Kabushiki Kaisha Toshiba, Japan

[21] Appl. No.: 763,225

[22] Filed: Aug. 7, 1985

[30] Foreign Application Priority Data

Aug. 20, 1984 [JP] Japan ............................... 59-172746

[51] Int. Cl.[4] ...................... H03H 17/06; G11C 19/28; G11C 27/02
[52] U.S. Cl. ..................................... 377/60; 333/165; 307/353
[58] Field of Search ....................... 377/60, 57, 58, 63, 377/75; 333/165; 307/353; 357/24

[56] References Cited

U.S. PATENT DOCUMENTS

| 4,287,441 | 9/1981 | Smith | 377/58 |
|---|---|---|---|
| 4,293,831 | 10/1981 | Lueder | 333/165 |
| 4,309,678 | 1/1982 | Picquendar | 333/165 |
| 4,488,129 | 12/1984 | Gonin et al. | 377/60 |
| 4,513,260 | 4/1985 | Ragan | 333/166 |
| 4,528,684 | 7/1985 | Iida et al. | 377/60 |

OTHER PUBLICATIONS

"Stable Output Circuit for a Dynamic Shift Register", IBM Technical Disclosure Bulletin, vol. 18, No. 2, Jul. 1985, pp. 459–460.

Primary Examiner—John S. Heyman
Assistant Examiner—Karl Ohralik
Attorney, Agent, or Firm—Finnegan, Henderson, Farabow, Garrett & Dunner

[57] ABSTRACT

A CCD output signal generating circuit includes a CCD type charge transfer device for transferring and outputting signal charges in response to the drive signal of a frequency $f_c$, an output circuit for generating an output signal corresponding to the output signal charges from the CCD type charge transfer device, and a correlated double sampling circuit. The CDD output signal generating circuit also has a low-pass filter circuit which, having a cut-off frequency set within a range of $2.5f_c$ to $4f_c$, and being connected between the output circuit and the correlated double sampling circuit, acts to filter an output signal from the output circuit before supplying the signal to the correlated double sampling circuit.

10 Claims, 7 Drawing Figures

CCD OUTPUT SIGNAL PROCESSING CIRCUIT FOR USE IN AN IMAGE PICK-UP DEVICE

BACKGROUND OF THE INVENTION

The present invention relates to a CCD output signal generating circuit for generating a CCD output signal used in a solid state image pickup device or the like.

FIG. 1 shows a conventional CCD output signal generating circuit comprising a charge coupled device (CCD) type charge transfer device 10 used to transfer signal charges responsive to an input signal from an input signal source VIN in response to three-phase drive pulses $\phi_1$ to $\phi_3$ of a frequency $f_c$ of, for example, 7 to 14 MHz, and a signal processing circuit 20 to process an output signal from the charge transfer device 10. The charge transfer device 10 comprises a CCD register 11 to transfer the signal charges in response to the three-phase drive pulses $\phi_1$ to $\phi_3$, and, simultaneously, to transfer the signal charges to a floating diffusion region 13 through the region under an output gate 12 to which a predetermined DC voltage VD is applied, a reset gate 14 to which a reset pulse $\phi_R$, synchronized with the drive pulses $\phi_1$ to $\phi_3$, is applied, and a drain region 15 to which a predetermined reset voltage VR is applied.

When the reset pulse $\phi_R$ is applied to the reset gate 14 in the charge transfer device 10, all signal charges in the floating diffusion region 13 flow into the drain region 15 through the region under the reset gate 14. In this instance, the potential of the floating diffusion region 13 is set to a reset level VR. Next, when the reset pulse $\phi_R$ is interrupted, the floating diffusion region 13 is disconnected from the drain region 15 so that the potential of the floating diffusion region 13 is set to a feed-through level. Thereafter, when the signal charges are led into the floating diffusion region 13 in response to the drive pulses $\phi_1$ to $\phi_3$, the floating diffusion region 13 is set to a potential corresponding to the amount of the signal charges. In this way, whenever the signal charges are time-sequentially transferred from the CCD register 11 into the floating diffusion region 13, the potential in the region 13 is sequentially set to the reset level VR, the feed-through level, and the signal level.

The signal processing circuit 20 comprises a source follower circuit or output circuit 21 which is constituted by a MOS transistor TR1, and which receives, at its gate, the voltage corresponding to the signal charges accumulated in the floating diffusion region 13, a load MOS transistor TR2 in which one end is connected to a power source terminal VB through the MOS transistor TR1 and the other end is grounded, and a correlated double sampling circuit 22 to eliminate the reset noise from the output signal of the output circuit 21. The MOS transistor TR2 can be used as a resistive element.

The output circuit 21 generates an output signal, shown in FIG. 2, in response to the voltage corresponding to the signal charges accumulated in the floating diffusion region 13. Specifically, when the potential of the region 13 is set to the reset level, feed-through level and signal level, respectively, the output signal is, similarly, set to accord with the reset level, feed-through level and signal level, respectively, for a reset period RSP, a feed-through level set period RVP and a signal level set period SVP.

In the voltage waveform shown in FIG. 2, a differential voltage A between the reset voltage for the reset period RSP and the feed-through voltage for the feed-through level set period RVP, is a synchronous noise synchronized with the resetting operation. A differential voltage B between the feed-through voltage and the signal voltage for the signal level set period SVP, is an output signal voltage corresponding to the signal charges in the floating diffusion region 13. Since the frequency of the synchronous noise is equal to the frequency $f_c$ of the drive pulses $\phi_1$ to $\phi_3$ of the CCD register 11, by coupling a low-pass filter, having a cut-off frequency of $\frac{1}{2} f_c$, with an output terminal of the output circuit 21, this synchronous noise can be eliminated.

In addition to this synchronous noise, two further kinds of noises are mixed into the output signal of the output circuit 21. One noise is caused due to the thermal noise generated in an ON resistance in the region under the reset gate 14 when the reset pulse $\phi_R$ is applied to the reset gate 14. The feed-through level for the feed-through level set period RVP varies at every cycle and appears as a reset noise $\Delta$B as shown in FIG. 2. The other noise is the noise generated in the output circuit 21.

To suppress the above-mentioned reset noise, the correlated double sampling circuit 22 is ordinarily connected to the output terminal of the output circuit 21. The correlated double sampling circuit 22 detects the difference B between the reference voltage level and the signal voltage level in each operation cycle and generates an output signal corresponding to the difference B. As described above, since the correlated double sampling circuit 22 generates the output signal corresponding to the difference B, it is possible to generate an output signal that is not influenced by the synchronous noise A shown in FIG. 2.

For example, as shown in FIG. 3, the correlated double sampling circuit 22 comprises a clamping circuit 220 to clamp the reference voltage in the output signal from the output circuit 21, at a predetermined level, a buffer amplifier BA1 to amplify an output voltage of the clamping circuit 220, a sample-hold circuit 230 to sample and hold an output voltage from the buffer amplifier BA1 during the foregoing signal voltage set period, and a buffer amplifier BA2 to amplify an output voltage from the sample-hold circuit 230. The clamping circuit 220 has a DC-cut capacitor C1 connected between the output circuit 21 and the amplifier BA1, and a switch SW1, turned on during the reference voltage set period, which is connected between an input terminal of the amplifier BA1 and the ground. The sample-hold circuit 230 includes a switch SW2 which is connected between the amplifiers BA1 and BA2 and turned on during the signal voltage set period, and a capacitor C2 connected between an input terminal of the amplifier BA2 and the ground.

As described above, by processing the output signal from the output circuit 21 by the correlated double sampling circuit 22, it is possible to derive an output signal, which is not influenced by the synchronous noise and reset noise included in the output signal, from the output circuit 21, the output signal corresponding to the signal charges accumulated in the floating diffusion region 13. However, the noises generated in the output circuit 21 can hardly be eliminated because of the alias of the high frequency noise, that is the reflection of the high frequency noise into the low frequency range.

The alias of the high frequency noise will now be described with reference to FIGS. 4A and 4B.

FIG. 4A shows, schematically, an example of the spectrum of the noises included in the output signal of the output circuit 21. The CCD output signal component from the output circuit 21 exists within a frequency range lower than $0.5 f_c$. Thus, in the case where the correlated double sampling circuit 22 is not used, this CCD output signal component is only affected by the noise component NA of a frequency lower than $0.5 f_c$. It is possible to ignore the influence of the noise components NB, NC, ND . . . , with frequencies between $(2n-1)f_c/2$ and $(2n+1)f_c/2$ (n is a positive integer).

In contrast, by use of the correlated double sampling circuit 22, the noise component NA below $0.5 f_c$, which is included in the output signal from the output circuit 22, is largely suppressed, as shown by the noise component $NA_1$ in FIG. 4B. At the same time, the other noise components NB, NC, ND . . . , are also suppressed in the respective corresponding frequency ranges, as indicated by the noise components $NB_2$, $NC_2$, $ND_2$ . . . . However, in this case, parts of the noises NB, NC, ND . . . , in the high frequency region, are aliased or reflected in the frequency range below $0.5 f_c$, so that the noise components $NB_1$, $NC_1$, $ND_1$, corresponding to the noise components NB, NC, ND . . . , could have been generated in the frequency range below $0.5 f_c$. Thus, there is a possibility that such noise components in the frequency region below $0.5 f_c$, which are included in the output signal from the correlated double sampling circuit 22, will become larger than the noise components in the frequency range below $0.5 f_c$, which are included in the output signal of the output circuit 21. Specifically, therefore, when the correlated double sampling circuit 22 is used, the synchronous noise can be eliminated and the reset noise suppressed, but the noises generated in the output circuit 21 can be neither eliminated nor suppressed.

SUMMARY OF THE INVENTION

It is an object of the present invention to provide a CCD output signal generating circuit for generating a CCD output signal in which various kinds of noise components are efficiently eliminated.

This object is accomplished by a CCD output signal generating circuit comprising a CCD type charge transfer device for transferring and outputting signal charges in response to the drive signal of a frequency $f_c$, an output circuit for generating an output signal corresponding to output signal charges from the CCD type charge transfer device, a low-pass filter circuit which is connected to the output circuit and has a cut-off frequency within a range of $2f_c$ to $6f_c$, and a correlated double sampling circuit connected to the low-pass filter circuit for sampling and holding an output signal from the low-pass filter circuit.

In this invention, by use of the low-pass filter circuit whose cut-off frequency is set to a frequency within a range of $2f_c$ to $6f_c$, the influence on the operation of the correlated double sampling circuit by the high frequency noises included in the output signal from the output circuit, is suppressed. Thus, it is from this correlated double sampling circuit that the CCD output signal, which does not include various kinds of noise components and corresponds to the signal charges from the charge transfer device, is derived.

DETAILED DESCRIPTION OF THE PREFERRED EMBODIMENT

Figure 1:
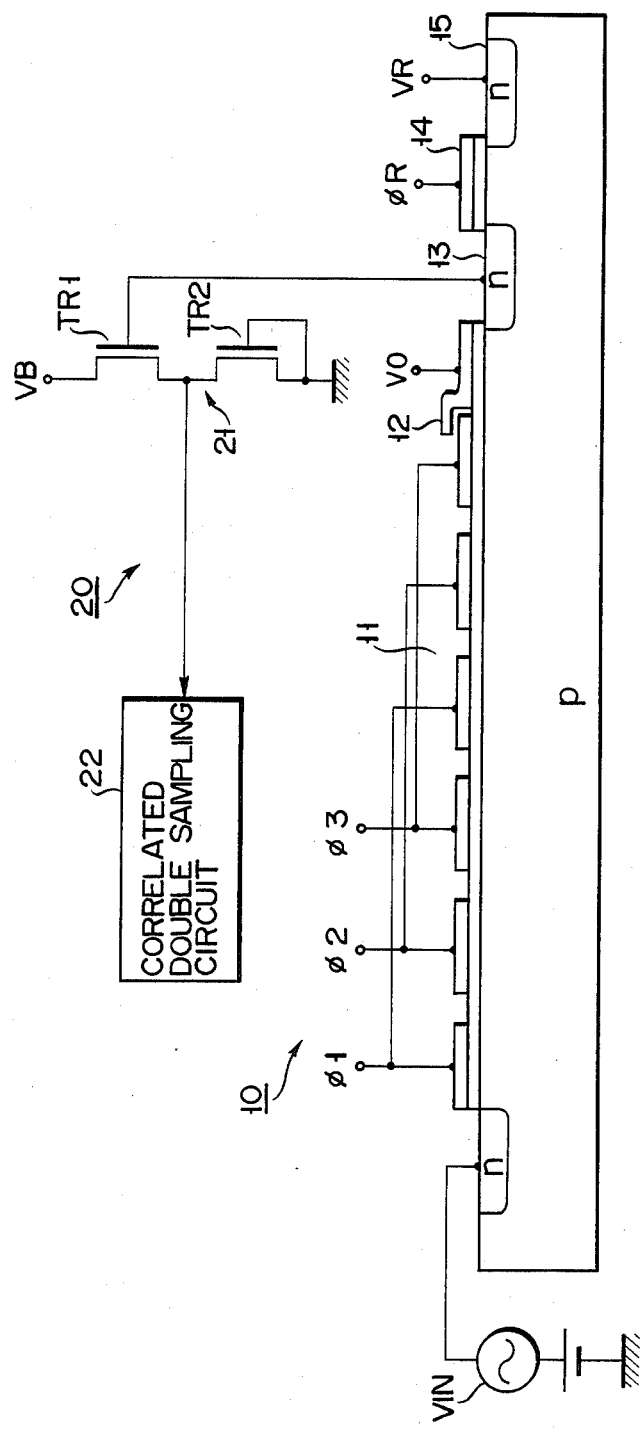
FIG. 1 shows a conventional CCD output signal generating circuit.
Figure 2:
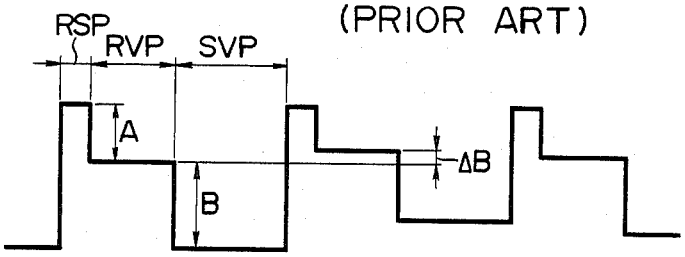
FIG. 2 is a signal waveform diagram for explaining the operation of the CCD output signal generating circuit shown in FIG. 1.
Figure 5:
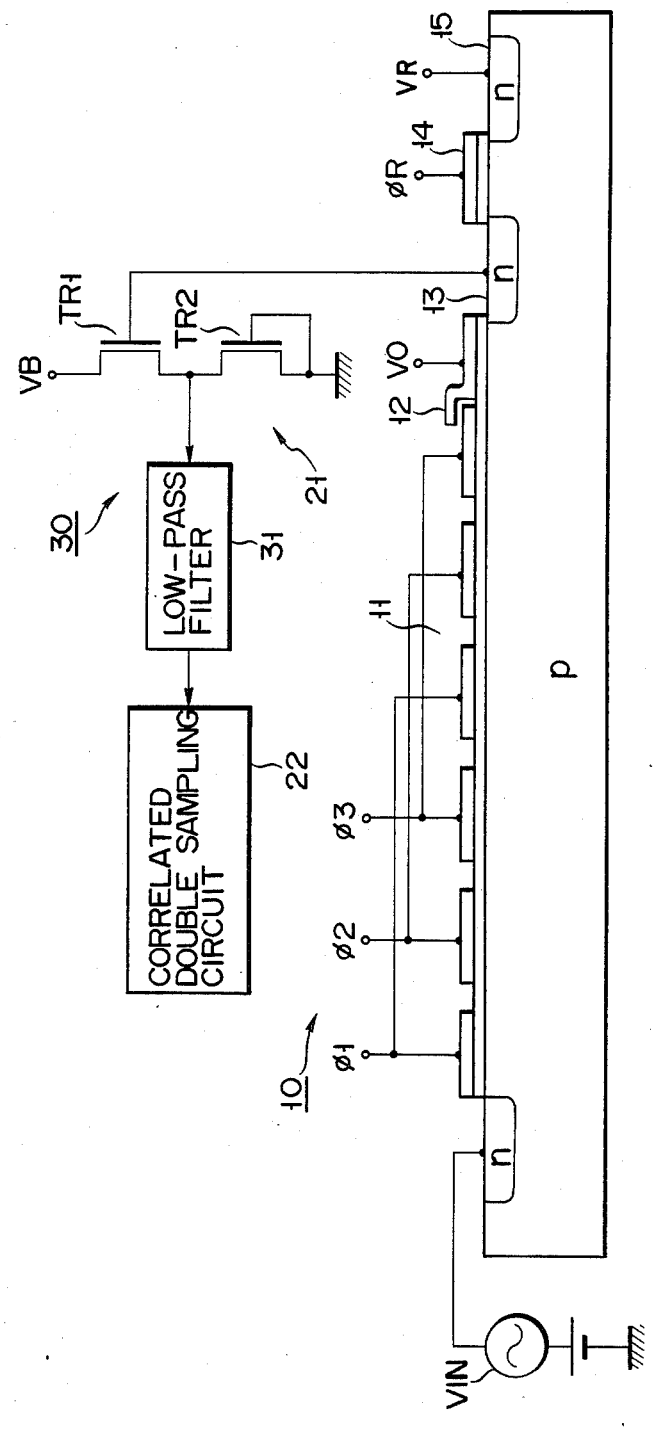
FIG. 5 shows a CCD output signal generating circuit according to one embodiment of the present invention.

FIG. 5 shows a CCD output signal generating circuit according to one embodiment of the present invention. Similar to the CCD output signal generating circuit shown in FIG. 1, the CCD output signal generating circuit of the invention comprises a CCD type charge transfer device 10 for transferring the signal charges in response to a drive signal of the frequency $f_c$, an output circuit 21, and a correlated double sampling circuit 22. The CCD output signal generating circuit of FIG. 5 also has a low-pass filter circuit 31 connected between the output circuit 21 and the correlated double sampling circuit 22. The output circuit 21, correlated double sampling circuit 22, and low-pass filter circuit 31 cooperatively constitute a CCD output signal processing circuit 30.

Figure 6:
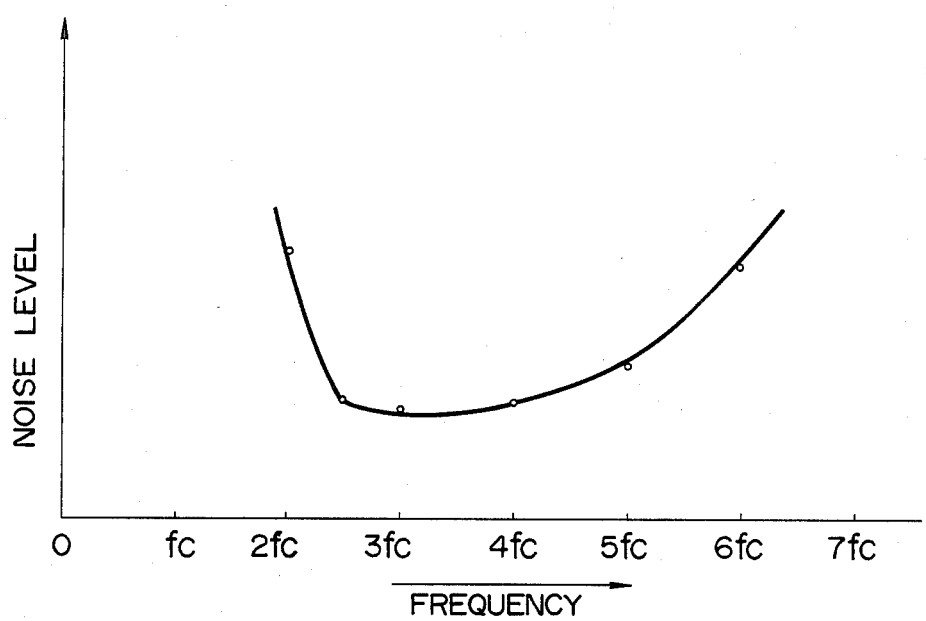
FIG. 6 is a graph showing a level change of the noise components included in the output signal of the correlated double sampling circuit where the cut-off frequency of the low-pass filter used in the CCD output signal generating circuit shown in FIG. 5 is changed.

By using the CCD output signal generating circuit shown in FIG. 5, the inventor of the invention claimed herein has empirically examined the change in level of the noise component included in the output signal and generated from the correlated double sampling circuit 22 when the cut-off frequency of the low-pass filter circuit 31 is changed, from which examination the experimental result data shown in FIG. 6 was derived. As will be apparent from the graph shown in FIG. 6, the influence of the alias of the high frequency noise included in the output signal of the output circuit 21 increases when the cut-off frequency of the low-pass filter circuit 31 is set on high, so that there is a tendency for the noise component included in the output signal of the correlated double sampling circuit 22 to increase. In contrast, when the cut-off frequency of the low-pass filter circuit 31 is set on low, for example, $0.5f_c$, it becomes difficult to separate the feed-through level set period RVP in the output signal of the output circuit 21 from the signal level set period SVP and, consequently, the noise component included in the output signal of the sampling circuit 22 increases. Specifically, as the cut-off frequency of the low-pass filter circuit 31 is gradually increased from, for instance, $0.5f_c$, the noise component from the correlated double sampling circuit 22 gradually decreases such that when the cut-off frequency is set to about $3f_c$, the noise component is minimized. When the cut-off frequency is enlarged further, the noise component again increases.

As is obvious from the graph shown in FIG. 6, if the cut-off frequency of the low-pass filter circuit 31 is set to a value which is two to six times, and, preferably, two and a half to four times as large as the frequency $f_c$ of the drive pulses $\phi_1$ to $\phi_3$, the noise component included in the output signal from the correlated double sampling circuit 22 can be effectively suppressed. In this case, the synchronous noise and reset noise included in the output signal from the output circuit 21 are, apparently, similarily suppressed in the correlated double sampling circuit 22.

As described above, the use of the CCD output signal generating circuit shown in FIG. 5 makes it possible to effectively suppress the noise that is caused due to the alias of the high frequency noise from the output circuit 21 as well as the synchronous noise and reset noise. The CCD output signal that accurately corresponds to the signal charges from the charge transfer device 10 can, therefore, be derived.

Figure 3:
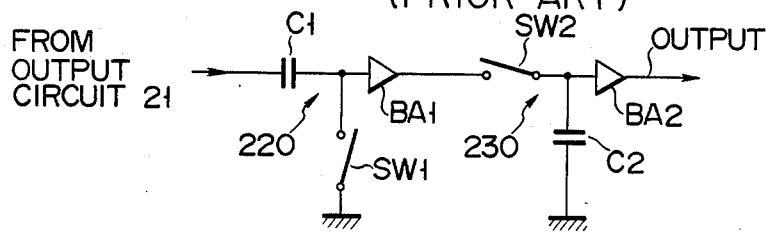
FIG. 3 is a circuit diagram of a correlated double sampling circuit used in the CCD output signal generating circuit shown in FIG. 1.
Figure 4A:
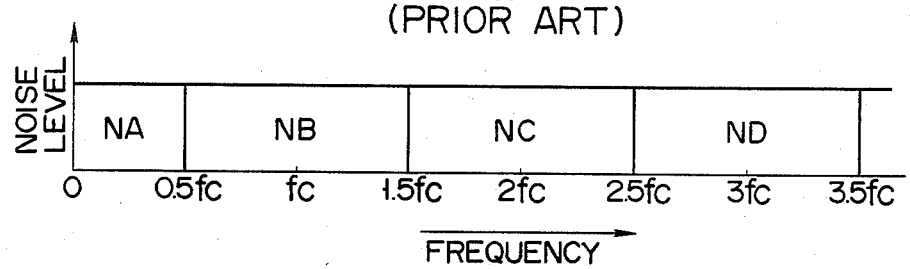
FIGS. 4A and 4B show an example of the spectra of the noise components included in output signals of the output circuit and the correlated double sampling circuit used in the CCD output signal generating circuit shown in FIG. 1.
Figure 4B:
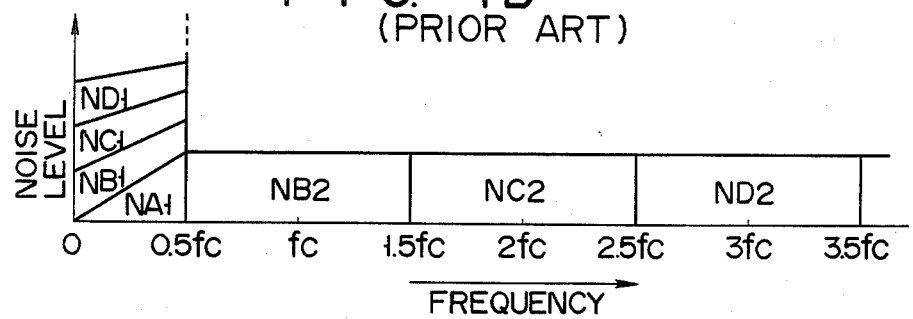

Although the present invention has been described in the above with respect to one embodiment, the invention is not limited to only this embodiment. For example, although the correlated double sampling circuit 22 is constituted as shown in FIG. 3, in place of this it is also possible to use a correlated double sampling circuit which is constituted by, for example, two sample-hold circuits that are similar to the sample-hold circuit 230 shown in FIG. 3. As well, it is possible to use a differential amplifier both for allowing the output signals corresponding to the reference and signal voltages from the output circuit 21 to be generated from these sample-hold circuits and for generating an output signal responsive to a difference between those output signals.

Further, the low-pass filter circuit 31 may be constituted by a resistor and a capacitor in a well known manner or by using both the resistance of a connection line connected between the circuits 21 and 22 and a capacitance connected to the connection line.

What is claimed is:

1. A CCD output signal generating circuit comprising:
   a CCD type charge transfer device for transferring and outputting signal charges in response to a drive signal of a frequency $f_c$;
   an output circuit for generating an output signal corresponding to output signal charges from said CCD type charge transfer device;
   a low-pass filter circuit, having a cut-off frequency limited to a range of $2f_c$ to $6f_c$, which is connected to said output circuit and eliminates a high frequency component over the cut-off frequency of an output signal from said output circuit; and
   a correlated double sampling circuit, connected to said low-pass filter circuit, for sampling and holding an output signal from said low-pass filter circuit.

2. A circuit according to claim 1, wherein the cut-off frequency of said low-pass filter circuit is set specifically within a range of $2.5f_c$ to $4f_c$.

3. A circuit according to claim 2, wherein said CCD type charge transfer device includes a floating diffusion region, connected to supply signal charges to said output circuit, a CCD register for transferring signal charges into said floating diffusion region in response to said drive signal, a drain region set at a reset potential, and a reset gate for selectively coupling said floating diffusion region to said drain region in response to a reset pulse; wherein each operation cycle is divided into a reset period in which said reset pulse is applied to said reset gate, a feed-through level set period in which said reset pulse is interrupted to separate said floating diffusion region from said drain region and a signal level set period in which signal charges are transferred from said CCD register into said floating diffusion region in response to said drive signal; and wherein said charge transfer device generates the output signal charges corresponding to a reset potential, a feed-through potential and a signal potential in said respective periods, said output circuit comprising a switching MOS transistor connected in series between first and second power source terminals and which receives, at its gate, the output signal charges from said charge transfer device and resistive means, and wherein an output voltage is supplied to said low-pass filter circuit from a junction between said switching MOS transistor and said resistive means.

4. A circuit according to claim 3, wherein said correlated double sampling circuit comprises a clamping circuit connected to said low-pass filter circuit for clamping the output signal generated from said low-pass filter circuit at a predetermined voltage level for said feed-through level set period in addition to generating an output voltage corresponding to the output signal generated from the low-pass filter circuit for said signal level set period, and a sample-hold circuit for sampling and holding the output voltage from said clamping circuit for said signal level set period.

5. A circuit according to claim 4, wherein said clamping circuit has a capacitor whose one end is connected to said low-pass filter circuit and has first switching means connected between the other end of said capacitor and a reference potential terminal, and wherein said sample-hold circuit has second switching means whose one end is connected to the other end of said capacitor and has a capacitor connected between the other end of said second switching means and said reference potential terminal.

6. A circuit according to claim 1, wherein said CCD type charge transfer device includes a floating diffusion region, connected to supply signal charges to said output circuit, a CCD register for transferring signal charges into said floating diffusion region in response to said drive signal, a drain region set at a reset potential, and a reset gate for selectively coupling said floating diffusion region to said drain region in response to a reset pulse; wherein each operation cycle is divided into a reset period in which said reset pulse is applied to said reset gate, a feed-through level set period in which said reset pulse is interrupted to separate said floating diffusion region from said drain region and a signal level set period in which signal charges are transferred from said CCD register into said floating diffusion region in response to said drive signal; and wherein said charge transfer device generates the output signal charges corresponding to a reset potential, a feed-through potential and a signal potential in said respective periods, said output circuit comprising a switching MOS transistor connected in series between first and second power source terminals and which receives, at its gate, the output signal charges from said charge transfer device and resistive means, and wherein an output voltage is supplied to said low-pass filter circuit from a junction between said switching MOS transistor and said resistive means.

7. A circuit according to claim 6, wherein said correlated double sampling circuit comprises a clamping circuit connected to said low-pass filter circuit for clamping the output signal generated from said low-pass filter circuit at a predetermined voltage level for said feed-through level set period in addition to generating an output voltage corresponding to the output signal generated from the low-pass filter circuit for said signal level set period, and a sample-hold circuit for sampling and holding the output voltage from said clamping circuit for said signal level set period.

8. A circuit according to claim 7, wherein said clamping circuit has a capacitor whose one end is connected to said low-pass filter circuit and has first switch means connected between the other end of said capacitor and a reference potential terminal, and said sample-hold circuit has second switching means whose one end is connected to the other end of said capacitor and has a capacitor connected between the other end of said second switching means and said reference potential terminal.

9. A circuit according to claim 3 wherein said resistive means is a load MOS transistor having one end connected to said first power source terminal through said switching MOS transistor and having the other end grounded and connected to the gate of said load MOS transistor.

10. A circuit according to claim 6 wherein said resistive means is a load MOS transistor having one end connected to said first power source terminal through said switching MOS transistor and having the other end grounded and connected to the gate of said load MOS transistor.

* * * * *